(12) United States Patent
Himori et al.

(10) Patent No.: US 8,512,511 B2
(45) Date of Patent: Aug. 20, 2013

(54) MOUNTING TABLE AND PLASMA PROCESSING APPARATUS

(75) Inventors: Shinji Himori, Nirasaki (JP); Yasuharu Sasaki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 890 days.

(21) Appl. No.: 12/560,924

(22) Filed: Sep. 16, 2009

(65) Prior Publication Data

US 2010/0071850 A1  Mar. 25, 2010

(30) Foreign Application Priority Data

Sep. 25, 2008 (JP) .................................. 2008-245722

(51) Int. Cl.
*H01L 21/3065* (2006.01)
*C23C 16/50* (2006.01)
*C23C 16/509* (2006.01)

(52) U.S. Cl.
USPC ............ 156/345.47; 156/345.51; 156/345.43; 118/728; 118/723 E

(58) Field of Classification Search
USPC ................. 118/728, 428, 723 E; 156/345.47, 156/345.51, 345.43, 345.44, 345.54, 345.23
See application file for complete search history.

(56) References Cited

U.S. PATENT DOCUMENTS

| 2005/0276928 | A1 | 12/2005 | Okumura et al. | |
| 2008/0041312 | A1* | 2/2008 | Matsuyama et al. | 118/728 |
| 2008/0062609 | A1* | 3/2008 | Himori et al. | 361/234 |

FOREIGN PATENT DOCUMENTS

JP  2004-363552  12/2004

OTHER PUBLICATIONS

Van Zeghbroeck, Bart. "Mobility—Resistivity—Sheet Resistance". http://ecee.colorado.edu/~bart/book/mobility.htm. 1996, 1997.*
Topsil Semiconductor. http://topsil.cms123.com/files/pdf/Topsil_HiRes_leaflet.pdf. See Wayback machine attachment from Apr. 19, 2004.*

* cited by examiner

*Primary Examiner* — Jeffrie R Lund
*Assistant Examiner* — Yuechuan Yu
(74) *Attorney, Agent, or Firm* — Rothwell, Figg, Ernst & Manbeck, P.C.

(57) ABSTRACT

A mounting table for use in a plasma processing apparatus, on which a substrate is mounted, includes: a conductive member connected to a high frequency power supply and a high frequency power supply; a dielectric layer embedded in a central portion on an upper surface of the conductive member; and an electrostatic chuck mounted on the dielectric layer. Further, the electrostatic chuck is connected to a high voltage DC power supply and includes an electrode film satisfying following conditions: $\delta/z \geq 85$ (where $\delta = (\rho_v/(\mu\pi f))^{1/2}$) and, a surface resistivity of the substrate > a surface resistivity of a central portion of the electrode film.

21 Claims, 11 Drawing Sheets

MOUNTING TABLE AND PLASMA PROCESSING APPARATUS

CROSS-REFERENCE TO RELATED APPLICATIONS

This application claims priority to Japanese Patent Application No. 2008-245722, filed on Sep. 25, 2008, the entire contents of which are hereby incorporated by reference.

FIELD OF THE INVENTION

The present invention relates to a mounting table for mounting thereon a substrate which is subjected to a plasma processing, and a plasma processing apparatus having the mounting table, and more particularly, to a mounting table in which a dielectric layer is embedded.

BACKGROUND OF THE INVENTION

In a process of manufacturing a semiconductor device, a plasma process, such as dry etching or ashing, is performed on a semiconductor wafer by using a plasma generated from a process gas. In a plasma processing apparatus performing the plasma process, for example, a pair of parallel electrodes, each having a plate shape, are positioned in parallel one above the other. High frequency power is applied between the pair of parallel plates to generate a plasma from a process gas. When the plasma process is carried out, the wafer is mounted on a lower electrode serving as a mounting table.

With an increasing demand for a plasma which has low ion energy and high electron density, high frequency power applied between the electrodes tends to have a very high frequency, e.g., 100 MHz, compared to conventional frequencies of, e.g., less than 20 MHz. However, it has been observed that if the frequency of the applied high frequency power rises, an electric field is strengthened at a space above the center of the surface of the electrode, i.e. the center of the wafer, but is weakened at a space above a peripheral portion of the surface of the electrode. Such non-uniform distribution in electric field may cause a non-uniform electron density in the plasma, so that, e.g., etching rate may vary depending on a position within the wafer in dry etching using ions. Thus, a problem may occur in that satisfactory in-plane uniformity can not be obtained in dry etching.

In order to cope with this problem, there is disclosed a plasma processing apparatus, which can make the electric field strength distributed uniformly and improve in-plane uniformity in a plasma process by embedding a dielectric layer made of, e.g. a ceramic, at the central of a top surface region of the lower electrode, i.e., mounting table (see, e.g., Japanese Patent Laid-open Application No. 2004-363552 and corresponding U.S. Patent Application Publication No. 2005/0276928 A1)

As shown in FIG. 10A, when high frequency power is applied from a high frequency power supply 82 to a lower electrode 81 in a plasma processing apparatus 80, a high frequency current flows along a surface of the lower electrode 81 to an upper part thereof by the skin effect, and then flows through a wafer W toward the central portion thereof. At this time, a part of the current leaks from the central portion of the wafer to the lower electrode 81 and then flows outward inside the lower electrode 81. Here, the high frequency current may more deeply penetrate into the portion of the lower electrode 81 at which a dielectric layer 83 is embedded than the other portions of the lower electrode 81; and accordingly, a hollow cylindrical resonance of TM mode is generated at the central portion of the lower electrode 81. Consequently, the electric field strength can be lowered at a space above the central portion of the wafer W, to thereby make the electric field strength uniformly distributed at the space above the wafer W.

Since a plasma process is normally conducted under a depressurized atmosphere, an electrostatic chuck 84 is used to firmly mount the wafer W in the plasma processing apparatus 80 as shown in FIG. 10B. A conductive electrode film 85 is interposed between a lower member and an upper member, which are made of a dielectric material, e.g., alumina, in the electrostatic chuck 84. During a plasma processing, high voltage DC power is supplied from a high voltage DC power supply 86 to the electrode film 85 to generate a coulomb force on a surface of the upper member of the electrostatic chuck 84, whereby the wafer W is electrostatically adsorbed and fixed.

Each component of the plasma processing apparatus 80 can be treated as a component of an electric circuit for a high frequency current. Further, the wafer W is formed of a semiconductor such as silicon, and thus, the wafer W is also considered as a component of the electric circuit. Since the wafer W is mounted in parallel with the electrode film 85 when the wafer W is electrostatically attracted to the electrostatic chuck 84, the wafer W and the electrode film 85 are considered to serve as resistors arranged in parallel in the electric circuit.

As a consequence, the value of a high frequency current flowing through the wafer W is dependent on a resistance of the wafer W and a resistance of the electrode film 85. For instance, when the resistance of the electrode film 85 is larger than that of the wafer W, high frequency current mainly flows from a peripheral portion to the central portion of the wafer W (see FIG. 11A). In such a case, a large potential difference occurs between the peripheral portion of the wafer W and the central portion of the wafer W as shown in FIG. 11B, so that a gate oxide film 87 is charged up and deteriorated.

Further, when the resistance of the electrode film 85 is very small, the high frequency current leaking from the central portion of the wafer W to the lower electrode 81 side can readily flow through the electrode film 85, and thus the high frequency current can not penetrate deep into the central portion. As a consequence, a hollow cylindrical resonance of TM mode is not produced and the electric field strength is non-uniformly distributed, which causes electron density of a plasma to be increased in a space above the central portion of the wafer W. Accordingly, a DC-like current flows between the central portion and the peripheral portion of the wafer W. This case also has the same problem as that described above in that the gate oxide film 87 of semiconductor devices disposed on the wafer W is charged up and deteriorated.

SUMMARY OF THE INVENTION

In view of the above, the present invention provides a mounting table and a plasma processing apparatus capable of preventing deterioration of an insulation film of semiconductor devices disposed on a substrate.

In accordance with a first aspect of the invention, there is provided a mounting table for use in a plasma processing apparatus, on which a substrate is mounted, including: a conductive member connected to a high frequency power supply for generating a plasma and a high frequency power supply for attracting ions; a dielectric layer embedded in a central portion on an upper surface of the conductive member; and an electrostatic chuck mounted on the dielectric layer, wherein the electrostatic chuck is connected to a high voltage DC power supply and includes an electrode film satisfying the following conditions: $\delta/z \geqq 85$ (where $\delta = (\rho_v/(\mu\pi f))^{1/2}$) and, a surface resistivity of the substrate>a surface resistivity of a central portion of the electrode film, where z refers to a thickness of the electrode film; $\delta$, to a skin depth of the electrode film with respect to high frequency power supplied from the high frequency power supply for generating a plasma; f, to a frequency of high frequency power supplied from the high frequency power supply for generating a plasma; $\pi$, to the circular constant; $\mu$, to a permeability of the electrode film; and $\rho_v$, to a resistivity of the electrode film.

In accordance with a second aspect of the present invention, there is provided a mounting table for use in a plasma processing apparatus, on which a substrate is mounted, including: a conductive member connected to a high frequency power supply for generating a plasma and a high frequency power supply for attracting ions; a dielectric layer embedded in a central portion on an upper surface of the conductive member; and an electrostatic chuck mounted on the dielectric layer, wherein the electrostatic chuck is connected to a high voltage DC power supply and includes an electrode film satisfying following conditions: $115\Omega/\square \leqq \rho_s$ and, a surface resistivity of the substrate>a surface resistivity of a central portion of the electrode film, where $\rho_s$: a surface resistivity of the electrode film.

In accordance with a third aspect of the present invention, there is provided a plasma processing apparatus having a mounting table on which a substrate is mounted, the mounting table including: a conductive member connected to a high frequency power supply for generating a plasma and a high frequency power supply for attracting ions; a dielectric layer embedded in a central portion on an upper surface of the conductive member; and an electrostatic chuck mounted on the dielectric layer, wherein the electrostatic chuck is connected to a high voltage DC power supply and includes an electrode film satisfying the following conditions: $\delta/z \geqq 85$ (where $\delta = (\rho_v/(\mu\pi f))^{1/2}$) and, a surface resistivity of the substrate>a surface resistivity of a central portion of the electrode film, where z refers to a thickness of the electrode film; $\delta$, to a skin depth of the electrode film with respect to high frequency power supplied from the high frequency power supply for generating a plasma; f, to a frequency of high frequency power supplied from the high frequency power supply for generating a plasma; $\pi$, to the circular constant; $\mu$, to a permeability of the electrode film; and $\rho_v$, to a resistivity of the electrode film.

In accordance with a fourth aspect of the present invention, there is provided a plasma processing apparatus having a mounting table on which a substrate is mounted, the mounting table including: a conductive member connected to a high frequency power supply for generating a plasma and a high frequency power supply for attracting ions; a dielectric layer embedded in a central portion on an upper surface of the conductive member; and an electrostatic chuck mounted on the dielectric layer, wherein the electrostatic chuck is connected to a high voltage DC power supply and includes an electrode film satisfying the following conditions: $115\Omega/\square \leqq \rho_s$ and, a surface resistivity of the substrate>a surface resistivity of a central portion of the electrode film, where $\rho_s$: a surface resistivity of the electrode film.

BRIEF DESCRIPTION OF THE DRAWINGS

The objects and features of the present invention will become apparent from the following description of embodiments, given in conjunction with the accompanying drawings, in which:

FIGS. 2A and 2B depict a case where high-power, high frequency power is supplied from a first high-frequency power supply in the plasma processing apparatus shown in FIG. 1, wherein FIG. 2A is a partial cross sectional view schematically illustrating a construction around an electrostatic chuck and FIG. 2B is a view illustrating an electric circuit including a first high-frequency power supply and the like;

FIGS. 3A and 3B depict a case where high-power, high frequency power is supplied from a second high-frequency power supply in the plasma processing apparatus shown in FIG. 1, wherein FIG. 3A is a partial cross sectional view schematically illustrating a construction around an electrostatic chuck and FIG. 3B is a view illustrating an electric circuit including a second high-frequency power supply and the like;

FIGS. 5A and 5B depict effects obtained by setting surface resistivity in a central portion of an electrode film in a mounting table in accordance with an embodiment of the present invention, wherein FIG. 5A is a view illustrating flow of a high frequency current from the second high-frequency power supply, and FIG. 5B is a view illustrating a potential distribution in a wafer;

FIGS. 6A to 6C depict simulation results of a potential distribution in a wafer when high frequency power supplied from a second high-frequency power supply has a frequency of 2 MHz, wherein FIG. 6A is a view illustrating a case where a boundary between a central portion of an electrode film and its peripheral portion is positioned about −10 mm closer to a peripheral portion of a lower electrode than a peripheral end of a dielectric layer, FIG. 6B is a view illustrating a case where the boundary is positioned at the same location as that of the peripheral end of the dielectric layer, and FIG. 6C is a view illustrating a case where the boundary is positioned about 10 mm closer to the peripheral portion of the lower electrode than the peripheral end of the dielectric layer.

FIGS. 10A and 10B depict cross sectional views schematically illustrating a construction of a plasma processing apparatus that may enhance an in-plane uniformity in conventional plasma processing, wherein FIG. 10A is a view illustrating a case where no electrostatic chuck is provided and FIG. 10B is a view illustrating a case where an electrostatic chuck is provided.

11A is a view illustrating flow of the high frequency current and FIG. 11B is a view illustrating a potential distribution in the wafer.

DETAILED DESCRIPTION OF THE EMBODIMENTS

Hereinafter, embodiments of the present invention will be described in detail with reference to the accompanying drawings which form a part hereof.

Figure 1:
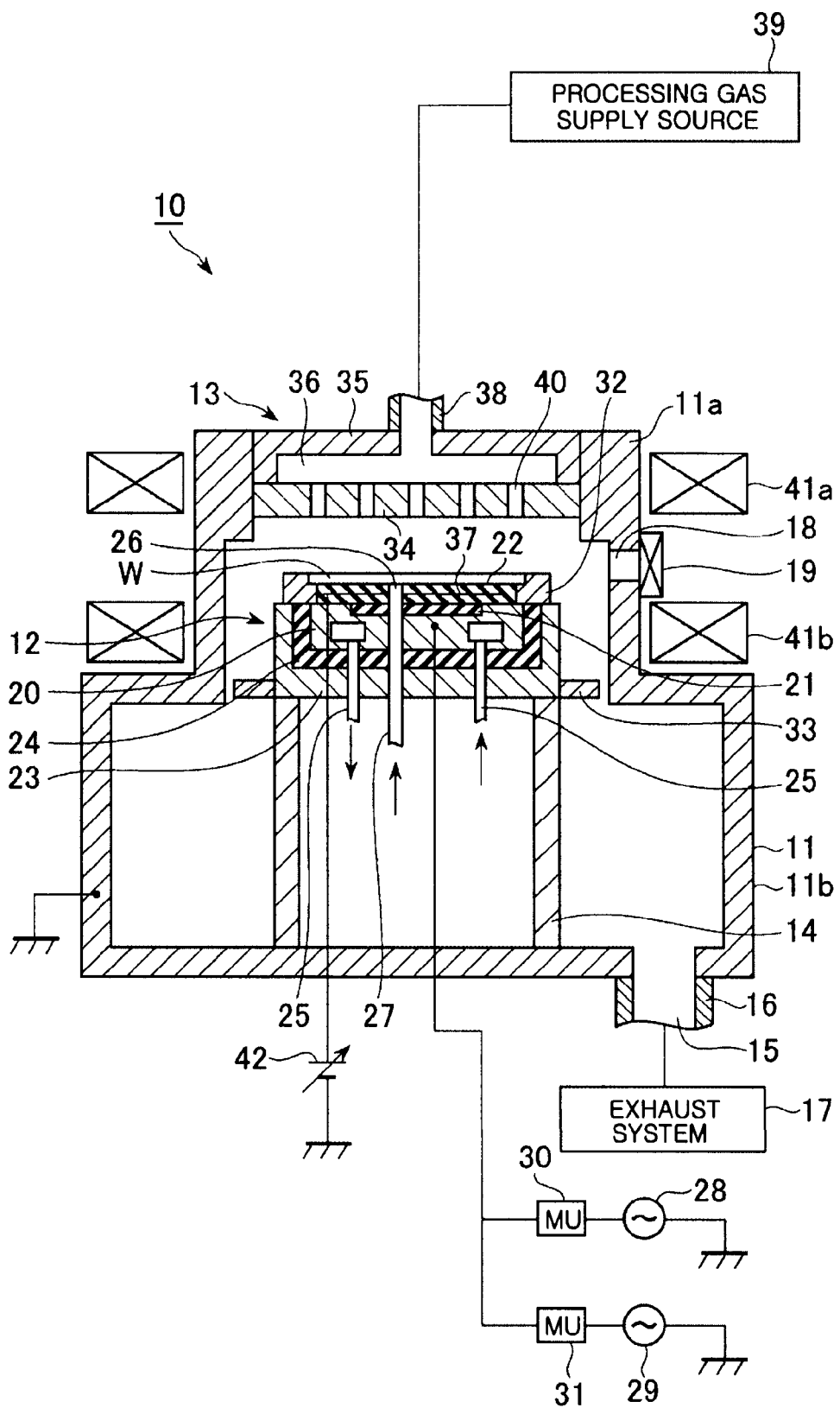
FIG. 1 is a cross sectional view schematically illustrating a construction of a plasma processing apparatus having a mounting table in accordance with an embodiment of the present invention.

FIG. 1 is a cross sectional view schematically illustrating a configuration of a plasma processing apparatus having a mounting table in accordance with an embodiment of the present invention. The plasma processing apparatus is configured to perform plasma etching, for example, RIE (Reactive Ion Etching), or ashing on a semiconductor wafer (substrate) having a diameter of, e.g., 300 mm.

Referring to FIG. 1, the plasma processing apparatus 10 includes a processing vessel 11 formed of, e.g., a vacuum chamber, a mounting table 12 supported by a supporting case disposed on a central part of the bottom wall of the processing vessel 11, and an upper electrode 13 disposed above and in parallel with the mounting table 12.

The processing vessel 11 has a cylindrical upper chamber 11a having a smaller diameter and a cylindrical lower chamber 11b having a larger diameter chamber. The upper chamber 11a and the lower chamber 11b communicate with each other, and the overall processing vessel 11 is configured to be airtightly sealed. The mounting table 12 and the upper electrode 13 are accommodated in the upper chamber 11a, and the supporting case 14 that supports the mounting table 12 and has pipes for a coolant and a backside gas therein is disposed in the lower chamber 11b.

An exhaust port 15 is prepared at the bottom of the lower chamber 11b and an exhaust system 17 is connected to the exhaust port 15 via an exhaust pipe 16. The exhaust system 17 includes, e.g., an APC (Adaptive Pressure Control) valve, a DP (Dry Pump) and TMP (Turbo Molecular Pump) (all not shown), which are controlled by a signal from a controller (not shown) so that the whole inner space of the processing vessel 11 is vacuum exhausted to maintain a desired vacuum level. Further, a transfer port 18 for transferring a wafer W is provided at a side wall of the upper chamber 11a to be opened and closed by a gate valve 19. The upper chamber 11a and the lower chamber 11b are formed of a conductive member such as aluminum and grounded.

The mounting table 12 includes a lower electrode 20 (conductive member), a dielectric layer 21, and an electrostatic chuck 22. The lower electrode 20 has a table shape formed of a conductive member, such as aluminum, to generate a plasma. The dielectric layer 21 is formed of a dielectric material, such as a ceramic, and is embedded in a central upper part of the lower electrode 20 to make the electric field strength uniformly distributed in a processing space as described later. The electrostatic chuck 22 electrostatically adsorbs and fixes the wafer W on a mounting surface. The lower electrode 20, the dielectric layer 21, and the electrostatic chuck 22 are disposed in the mounting table 12 in that order. Further, the lower electrode 20 is secured on a supporting table 23 disposed on the supporting case 14 via an insulation member 24 and is fully electrically isolated from the processing vessel 11.

The lower electrode 20 has a coolant flow path 25 through which a coolant flows. When a coolant flows through the coolant flow path 25, the lower electrode 20 is cooled so that the wafer W mounted on a mounting surface of the electrostatic chuck 22 is cooled to a desired temperature.

The electrostatic chuck 22 is formed of a dielectric material and contains a conductive electrode film 37 therein. The electrode film 37 is formed of, for example, an electrode material produced by mixing molybdenum carbide (MoC) with Alumina ($Al_2O_3$). The electrostatic chuck 22 has a circular plate shape similar to the wafer W to electrostatically adsorb the wafer W securely, and accordingly, the electrode film 37 contained in the electrostatic chuck 22 also has the shape of a circular plate. Further, the electrode film 37 is configured such that the surface resistivity of the central portion 37a is smaller than that of a peripheral portion 37b, as will be described later. A high voltage DC power supply 42 is connected to the electrode film 37, and high voltage DC power supplied to the electrode film 37 generates a coulomb force between the mounting surface of the electrostatic chuck 22 and the wafer W to electrostatically adsorb and fix the wafer W.

Further, the electrostatic chuck 22 has a through hole 26 for discharging a backside gas to raise a heat transfer rate between the mounting surface and a rear surface of the wafer W. The through hole 26 communicates with a gas flow path 27 provided in the lower electrode 20. A backside gas, such as helium (He), which has been supplied from a gas supplier (not shown) via the gas flow path 27, is discharged through the through hole 26.

In the lower electrode 20, a first high-frequency power supply 28 (high frequency power supply for generating a plasma) for supplying high frequency power whose frequency is, for example, 40 MHz or more, and a second high-frequency power supply 29 (high frequency power supply for attracting ions) for supplying high frequency power whose frequency is, for example, 13.56 MHz or less, which is lower than that of the first high-frequency power supply 28, are connected to each other via matching units (MUs) 30 and 31. High frequency power supplied from the first high-frequency power supply 28 generates a plasma from a processing gas as described later and high frequency power supplied from the second high-frequency power supply 29 supplies bias power to the wafer W to draw ions from the plasma to the wafer W.

Further, a focus ring 32 is arranged at an outer peripheral portion on the top surface of the lower electrode 20 to surround the electrostatic chuck 22. The focus ring 32 expands a plasma in a processing space to wider than a space directly above the wafer W, to enhance the uniformity of etching rate in the surface of the wafer W.

A baffle plate 33 is disposed outside of a lower part of the supporting table 23 to surround same. By the baffle plate 33, a processing gas flows from the upper chamber 11a to the lower chamber 11b through a gap provided between the baffle plate 33 and a wall portion of the upper chamber 11a. Namely, the baffle plate 33 serves as a rectifying plate for rectifying flow of the process gas and prevents a plasma from leaking to the lower chamber 11b from the processing space to be described later.

In addition, the upper electrode 13 further includes a ceiling electrode plate 34 formed of a conductive material contacted with an inner surface of the upper chamber 11a, an electrode plate support 35 that supports the ceiling electrode plate 34, and a buffer chamber 36 disposed below the electrode plate support 35. One end of a gas inlet pipe 38 is connected to the buffer chamber 36 and the other end thereof is connected to a processing gas supply source 39. The processing gas supply source 39 includes a control unit (not shown) for controlling the amount of supplying the processing gas. Further, a plurality of gas supply holes 40 is provided through the ceiling electrode plate 34 to allow the buffer chamber 36 to communicate with the upper chamber 11a.

Since the processing gas supplied from the processing gas supply source 39 to the buffer chamber 36 is dispersedly supplied through the gas supply holes 40 in the upper electrode 13, the upper electrode 13 serves as a shower head for the processing gas. In addition, since the upper electrode 13 is fixed onto an inner wall of the upper chamber 11a, a conductive path is formed between the upper electrode 13 and the processing vessel 11.

Two multi-pole ring magnets 41a and 41b are respectively arranged above and beneath the gate valve 19 around the upper chamber 11a of the plasma processing apparatus 10. In the multi-pole ring magnets 41a and 41b, a plurality of anisotropic segment columnar magnets (not shown) are accommodated in a casing (not shown) of a ring-shaped magnetic material and are arranged in the casing, such that a magnetic pole of one of two neighboring anisotropic segment columnar magnets is opposite to that of the other. Accordingly, magnetic force lines are created between two neighboring segment columnar magnets, and a magnetic field is generated around the processing space located between the upper electrode 13 and the lower electrode 20, so that a plasma is trapped in the processing space by the magnetic field. Further, the plasma processing apparatus 10 may be configured not to have the multi-pole ring magnets 41a and 41b.

When RIE or ashing is performed on the wafer W in the plasma processing apparatus 10, the pressure in the processing vessel 11 is adjusted to have a desired vacuum level and a processing gas is introduced into the upper chamber 11a. And then the high frequency powers are supplied from the first high-frequency power supply 28 and the second high-frequency power supply 29 to generate a plasma from the processing gas. Accordingly, ions contained in the plasma are drawn to the wafer W. To generate a plasma that has low ion energy and high electron density, the high frequency power of 40 MHz or more may be supplied from the first high-frequency power supply 28. Further, the high frequency power of 13.56 MHz or less may be supplied from the second high-frequency power supply 29 so that the ions contained in the plasma can be securely drawn toward the wafer W. The high frequency electric powers supplied from the first high-frequency power supply 28 and the second high-frequency power supply 29 flow through a path passing from the lower electrode 20 to the ground through the plasma, the upper electrode 13, a wall portion of the processing vessel 11 in that order.

In the plasma processing apparatus 10, the high frequency power supplied from the first high-frequency power supply 28 has a high frequency (40 MHz or more) which tends to cause the electric field strength to be greater at a portion directly above the central portion of the wafer W in the processing space. To make the electric field strength uniformly distributed in the processing space by removing such tendency, the plasma processing apparatus 10 further includes the dielectric layer 21 on the lower electrode 20. The existence of the dielectric layer 21 allows a high frequency current from the first high-frequency power supply to penetrate from the central portion of the wafer W deeply to the dielectric layer 21 on the lower electrode 20 via the electrostatic chuck 22. As a consequence, a hollow cylindrical resonance of TM mode occurs at the central portion of the lower electrode 20, so that the electric field strength can be uniformly distributed in the processing space.

Figure 2A:
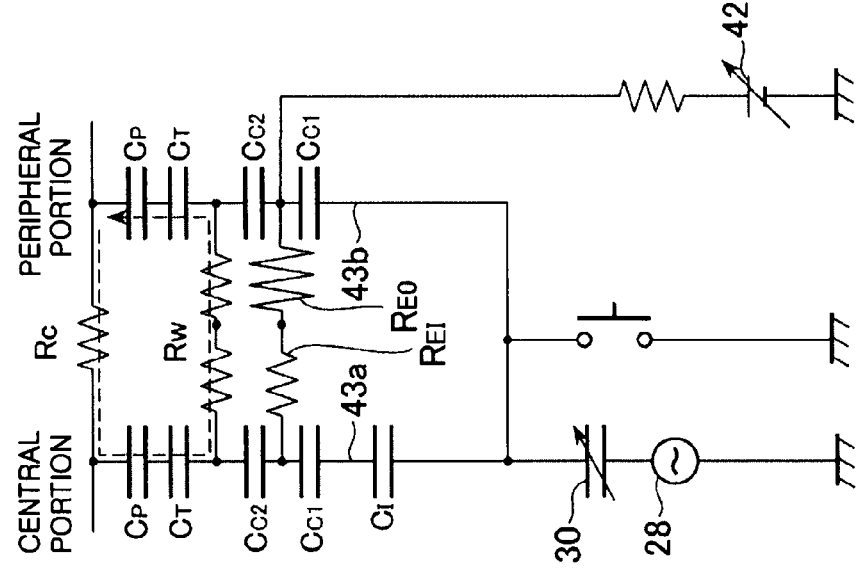
Figure 2B:
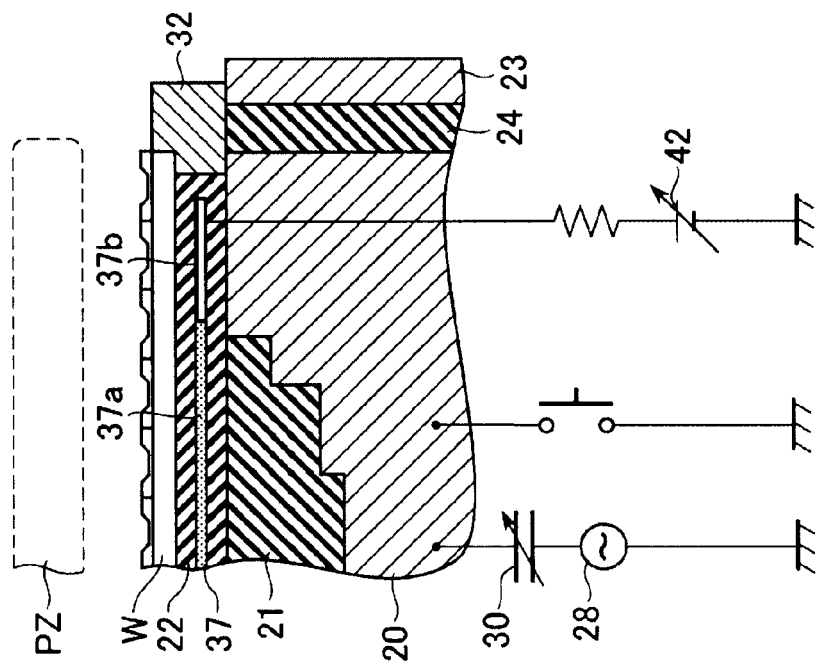
Figure 3A:
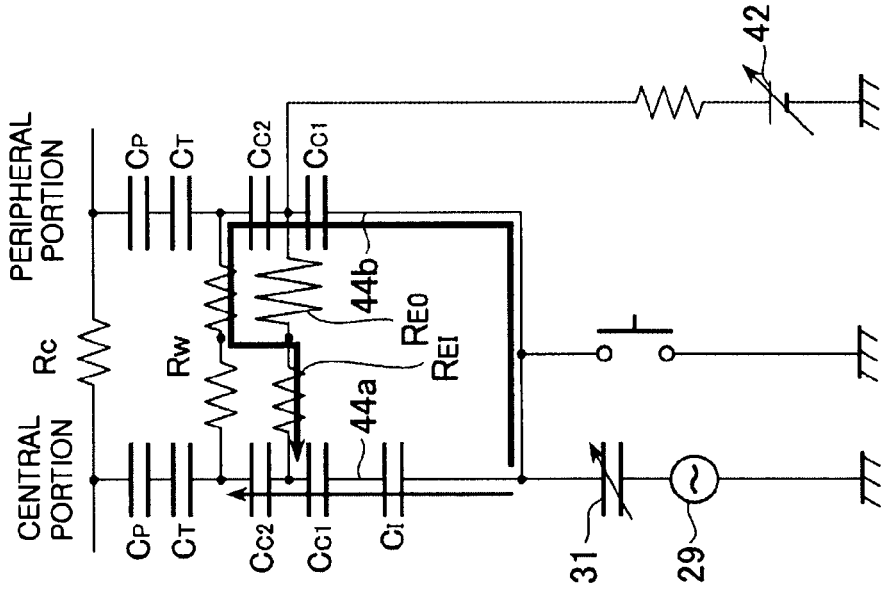

In the plasma processing apparatus 10, the first high-frequency power supply 28, the lower electrode 20, the dielectric layer 21, the electrostatic chuck 22, the electrode film 37 (central portion 37a and peripheral portion 37b), the wafer W, and the plasma PZ (see FIG. 2A) generated in the processing space constitute an equivalent circuit 43 as shown in FIG. 2B. Further, the second high-frequency power supply 29 and the other components shown in FIG. 3A constitute an equivalent circuit 44 as shown in FIG. 3B.

Figure 3B:
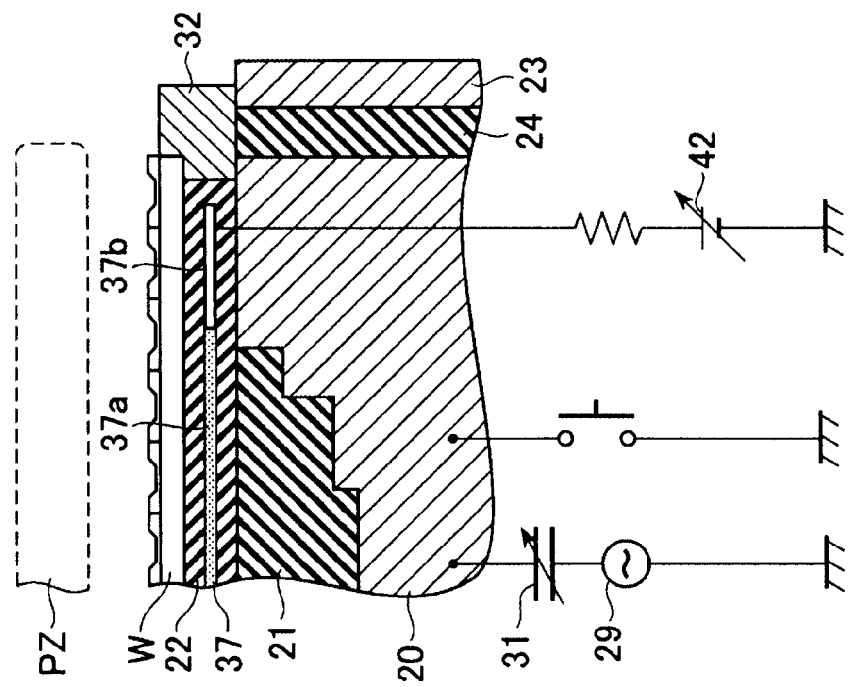

Referring to FIGS. 2B and 3B, a capacitance $C_I$ is a equivalent capacitance of the dielectric layer 21; a capacitance $C_{c1}$ is a capacitance between the lower electrode 20 and the electrostatic chuck 22; a capacitor $C_{c2}$ is a capacitance between the electrostatic chuck 22 and the wafer W; a capacitor $C_T$ is a capacitance of a gate oxide film; a capacitor $C_p$ is a capacitance of the plasma PZ; a resistance $R_c$ is a resistance of the plasma PZ, a resistor $R_w$ is a resistance of the wafer W; a resistor $R_{EI}$ is a resistance of the central portion 37a of the electrode film 37; and a resistor $R_{EO}$ is a resistance of the peripheral portion 37b of the electrode film 37.

Since the dielectric layer 21 is present only around the central portion of the lower electrode 20 in the equivalent circuits 43 and 44 shown in FIGS. 2B and 3B, it is considered that there exist a circuit 43a (44a) corresponding to the central portion of the lower electrode 20 and a circuit 43b (44b) corresponding to the peripheral portion of the lower electrode 20, wherein the two circuits 43a and 43b (44a and 44b) are bridged by the resistance Rw of the wafer W, and the resistances $R_{EI}$ and $R_{EO}$ of the electrode film 37. Further, since the wafer W and the electrode film 37 are disposed in parallel with each other when the wafer W is mounted on the mounting surface of the electrostatic chuck 22, the resistance Rw is arranged in electrically parallel with the resistances $R_{EI}$ and $R_{EO}$.

When the resistance $R_E$ (particularly, $R_{EO}$) of the electrode film 37 is small when a high-power, high frequency power is supplied from the first high-frequency power supply 28, a high frequency current, which propagate from the central portion of the wafer W to the electrostatic chuck 22 in a thickness direction, flows from the central portion 37a of the electrode film 37 to the peripheral portion 37b instead of penetrating into the dielectric layer 21, so that the high frequency current hardly reaches the dielectric layer 21. Resultantly, it is difficult to generate an electric field which originates from the high frequency current penetrating into the dielectric layer 21 and penetrates through the electrode film 37. This phenomenon will be described below.

In this embodiment, a skin depth δ of the electrode film 37 is employed as an index that indicates a degree of reduction of an electric field penetrating into the electrode film 37. The skin depth δ means a depth by which an electric field penetrating into the electrode film 37 is reduced as much as 1/e. As the skin depth δ increases, the electric field is difficult to be reduced and can easily penetrate into the electrode film 37, whereas as the skin depth δ decreases, the electric field is easily reduced and it is difficult for the electric field to penetrate into the electrode film 37. The skin depth δ can be defined by Eq. 1 as follows:

$$\delta = (2\rho_v/(\mu\omega))^{1/2} = (\rho_v/(\mu\pi f))^{1/2} \qquad \text{Eq. 1}$$

where μ refers to a permeability (H/m) of the electrode film 37; ω, to 2πf (n being the circular constant, and f being the frequency (Hz) of the high frequency power supplied from the first high-frequency power supply 28); and $\rho_v$, to a resistivity (Ω·m) of an electrode material constituting the electrode film 37.

Further, an electric field E generated at the electrode film 37 can be expressed by Eq. 2 based on Maxwell's equations:

$$E = E_0 \cdot \exp(-i\omega t) \cdot \exp(iz/\delta) \cdot \exp(-z/\delta) \qquad \text{Eq. 2,}$$

where z refers to the thickness of the electrode film 37; and $E_0$ refers to a strength of an electric field incident onto the electrode film 37.

That is, a penetration ratio "$E/E_0$" by which an electric field of high frequency power supplied from the first high-frequency power supply 28 penetrates through the electrode film 37 is proportional to "$\exp(-z/\delta)$" as represented in Eq. 3:

$$E/E_0 \propto \exp(-z/\delta) \qquad \text{Eq. 3}$$

As the value "$z/\delta$" is close to "0" in Eq. 3, the penetration ratio of the electric field approaches 1.0 (100%), and as "$\delta$" is smaller, the penetration ratio of the electric field is reduced. Here, the resistance $R_E$ of the electrode film 37 being small means the resistivity $\rho_v$ of the electrode film 37 is small. Therefore, as the resistance $R_E$ is smaller, the skin depth $\delta$ represented as "$(\rho_v/(\mu\pi f))^{1/2}$" is reduced, so that it becomes difficult to generate an electric field that penetrates through the electrode film 37.

If an electric field penetrating through the electrode film 37 is less generated, a weaker hollow cylindrical resonance of TM mode occurs in the central portion of the lower electrode 20, and the electric field strength in a space directly above the central portion of the wafer W (hereinafter, referred to as "central space") in the processing space becomes larger than the electric field strength in a space directly above the peripheral portion of the wafer W in the processing space, resulting in the increased electron density at the central space. As a result, the etching rate distribution becomes non-uniform in the surface of the wafer W.

Moreover, the non-uniformity in distribution of electron density of a plasma causes a DC-like current (indicated by a dashed-line arrow in FIG. 2B) to be created along a circuit consisting of the resistance $R_c$, the capacitance $C_p$, the capacitance $C_T$, and the resistance $R_w$ in the equivalent circuit 43.

When the DC-like current flows through the wafer W, the gate oxide film (insulation film) of the semiconductor device (hereinafter, simply referred to as "device") placed on the wafer W may be charged up and thus can be damaged and deteriorated.

To make the etching rate uniformly distributed an the surface of the wafer W and prevent the gate oxide film of the device from being deteriorated in case that high-power, high frequency power is supplied from the first high-frequency power supply 28, it is needed to generate an electric field penetrating through the electrode film 37 by suppressing a high frequency current from the first high-frequency power supply 28 to flow through the electrode film 37 and allowing the high frequency current to penetrate into the dielectric layer 21. For this purpose, it may be appropriate to increase $\delta/z$ in the Eq. 3. To increase $\delta/z$, it may be appropriate to increase the skin depth $\delta$. Since the skin depth $\delta$ is represented as "$(\rho_v/(\mu\pi f))^{1/2}$" as described above, it may be appropriate to increase the resistance $R_E$ of the electrode film 37 by using a conductive material with high resistivity $\rho_v$ to increase the skin depth $\delta$ if the frequency is constant. Further, as the frequency of the high frequency power is higher, the skin depth $\delta$ is smaller ($\delta \propto (1/\omega)=(\frac{1}{2}\pi f)$). Therefore, it may be appropriate to use an electrode material with a larger resistivity $\rho_v$ as the material constituting the electrode film 37 when the frequency of the high frequency power is adapted to be higher.

A plurality of electrode films 37, each having a different value of $\delta/z$ (and resistance $R_E$) from that of the others, were prepared by the inventors to find $\delta/z$ (and resistance $R_E$) that may prevent the gate oxide film of the device from being deteriorated due to a charge-up damage and make the etching rate uniformly distributed on the surface of the wafer W by preventing the non-uniformity in electron density distribution of the plasma in the processing space. And, ashing was performed on a photoresist of each of various wafers W in the plasma processing apparatus 10 by using the electrode film 37 thus prepared, the etching rate distribution of the photoresist on the surface of each wafer W was observed, and the results were depicted as a graph shown in FIG. 4. Hereinafter, the resistance of the electrode film 37 is represented by the surface resistivity $\rho_s$ to remove effects by the thickness of the electrode film 37 from the resistance $R_E$. The surface resistivity $\rho_s$ refers to a resistance per unit area represented in Eq. 4, and is determined based on a property value (resistivity $\rho_v$) of the electrode material constituting the electrode film 37 and the thickness of the electrode film 37.

$$\rho_s = \rho_v/z (\Omega/\square) \qquad \text{Eq. 4,}$$

where ($\delta/z$ and $\rho_s$) of each electrode film 37 used herein was (7518, $8.9 \times 10^5 \Omega/\square$), (6711, $2.67 \times 10^5 \Omega/\square$), (297, $1740\Omega/\square$), (195, $750\Omega/\square$), (124, $304\Omega/\square$), (103, $208\Omega/\square$), (92, $166\Omega/\square$), (85, $115\Omega/\square$), and (47, $35\Omega/\square$).

In the ashing process, a single gas of $O_2$ was introduced as the processing gas into the upper chamber 11a by a flow rate of 100 sccm, and the high frequency power supplied from the first high-frequency power supply 28 and frequency thereof were set 2000 W, and 100 MHz, no high frequency power was supplied from the second high-frequency power supply 29.

Figure 4:
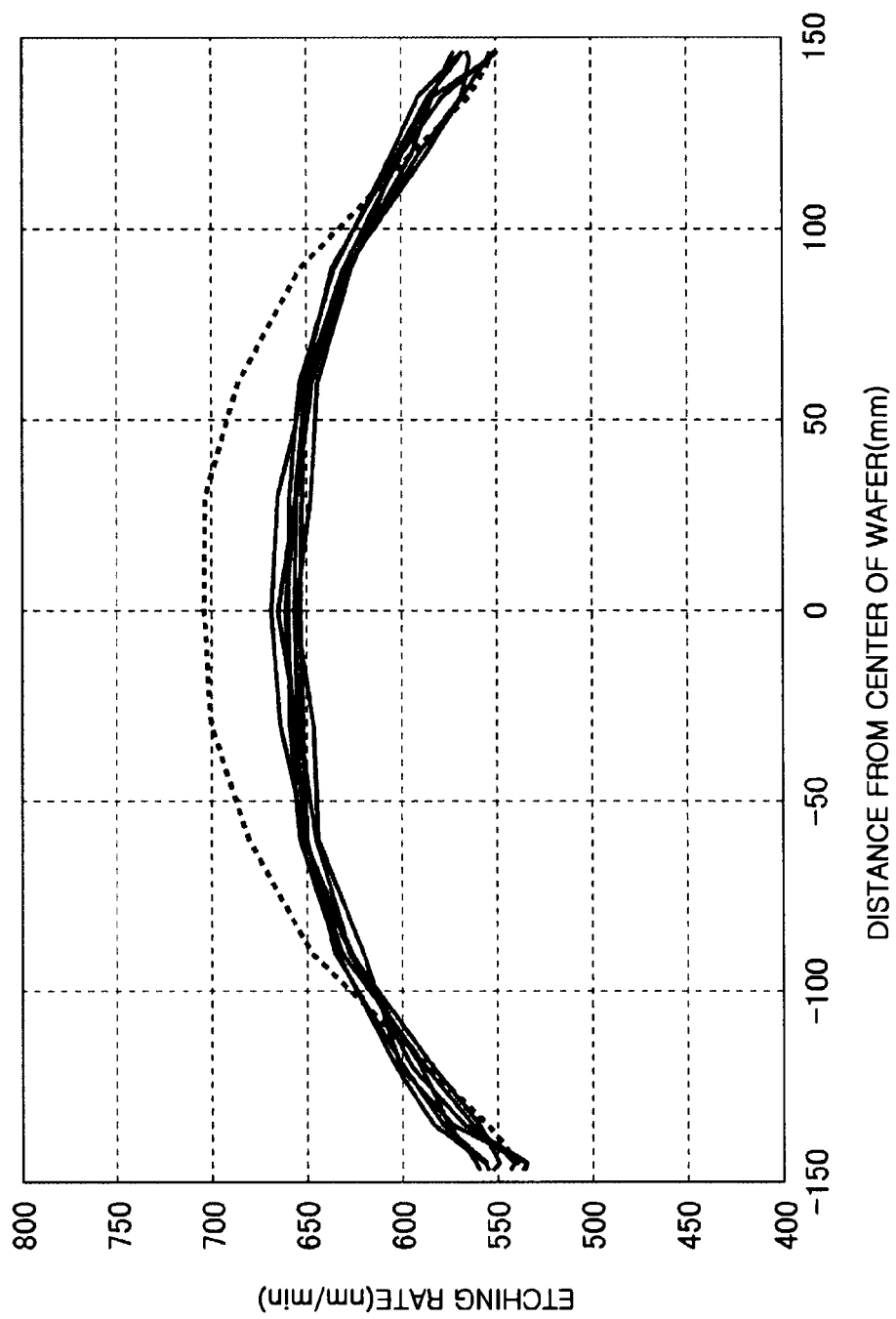
FIG. 4 is a graph illustrating an etching speed distribution of photoresist in a surface of each wafer when a plurality of electrode films, each having a different value of $\delta/z$ from that of the others.

In the graph depicted in FIG. 4, the horizontal axis refers to a distance from the center of the wafer W and the vertical axis refers to an etching rate (nm/minute). In addition, the dashed-line refer to the case where ($\delta/z$, surface resistivity)=(47, $35\Omega/\square$) and solid lines refer to the cases where $\delta/z \geqq 85$ and surface resistivity $\geqq 115\Omega/\square$.

It was found in the graph depicted in FIG. 4 that the etching rate distribution can be nearly uniform on the surface of the wafer W in case that $\delta/z$ is set to be equal to or more than 85 or $\rho_s$ is $115\Omega/\square$ or more. Further, it is considered that the distribution of electron density of the plasma is almost uniform in the processing space from a fact that the etching rate is nearly uniformly distributed. From this view, it was found that if $\delta/z$ is adapted to be equal to or more than 85 or $\rho_s$ is $115\Omega/\square$ or more, deterioration of the gate oxide film due to a charge-up damage may be substantially prevented in the device. In this embodiment, $\delta/z$ is set to be equal to or more than 85 or $\rho_s$ is set to be $115\Omega/\square$ or more based on observations of the above-described etching rate distribution.

Further, the capacitance $C_I$ of the dielectric layer 21 is present in the electric circuit 44a corresponding to the central portion of the lower electrode 20. Therefore, when high-power, high frequency power is supplied from the second high-frequency power supply 29 in the equivalent circuit 44, a high frequency current from the second high-frequency power supply 29 primarily flows not through the electric circuit 44a but through the electric circuit 44b corresponding to the peripheral portion of the lower electrode 20 and then flows back to the electric circuit 44a, as indicated by a thick solid line arrow in FIG. 3B.

Here, the resistance $R_E$ of the electrode film 37 is set to be large to prevent the non-uniformity in distribution of electron density of the plasma in the processing space in case that high-power, high frequency power is supplied from the first high-frequency power supply 28 as described above. Therefore, the resistance $R_E$ of the electrode film 37 can be larger than the resistance $R_w$ of the wafer W. If the resistance $R_E$ ($R_{EI}$, $R_{EO}$) of the electrode film 37 is set to be larger than the resistance $R_w$ of the wafer W, the high frequency current can flow back to the electric circuit 44a primarily not through the electrode film 37 but through the wafer W from the peripheral portion to the central portion. At this time, a large voltage difference is generated from the peripheral portion of the wafer W toward the central portion of the wafer W, and thus the charge balance of the gate oxide film (insulation film) collapses on the surface of the wafer W. As a consequence, the gate oxide film may be charged up in the device placed on the wafer W, thus to be damaged and deteriorated.

To prevent the deterioration of the gate oxide film of the device caused by charge-up damage when a high-power, high frequency power is supplied from the second high-frequency power supply 29, it is needed to prevent the high frequency current from the second high-frequency power supply 29 from flowing from the peripheral portion of the wafer W to the central portion thereof. For this purpose, it may be appropriate to make the high frequency current flow not through the central portion of the wafer W but through the central portion of the electrode film 37.

To allow the high frequency current to flow not through the central portion of the wafer W but through the central portion of the electrode film 37, it may be appropriate to make the resistance $R_{EI}$ of the central portion 37a of the electrode film 37 smaller than the resistance $R_w$ of the central portion of the wafer W, so that it becomes difficult for the high frequency current flowing through the peripheral portion of the wafer W to flow through the central portion of the wafer W. In view of this, the surface resistivity of the central portion 37a of the electrode film 37 is set smaller than that of the wafer W in this embodiment.

Figure 5A:
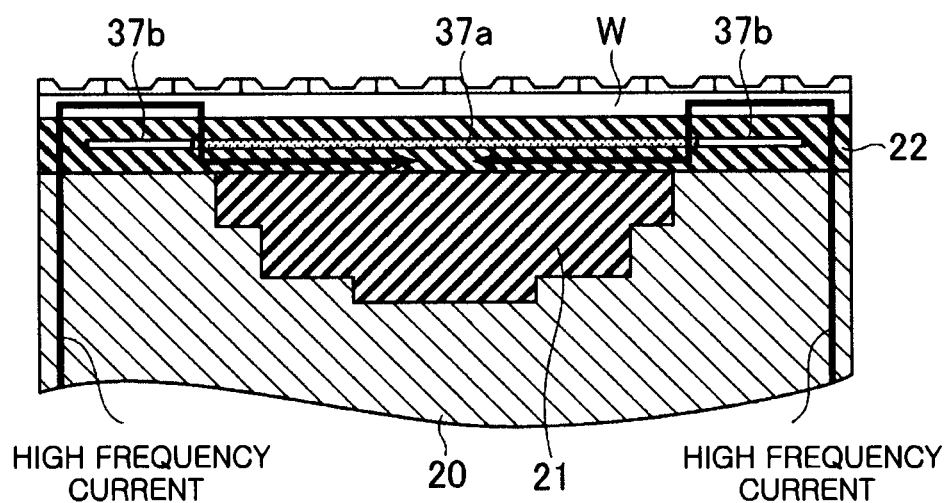
Figure 5B:
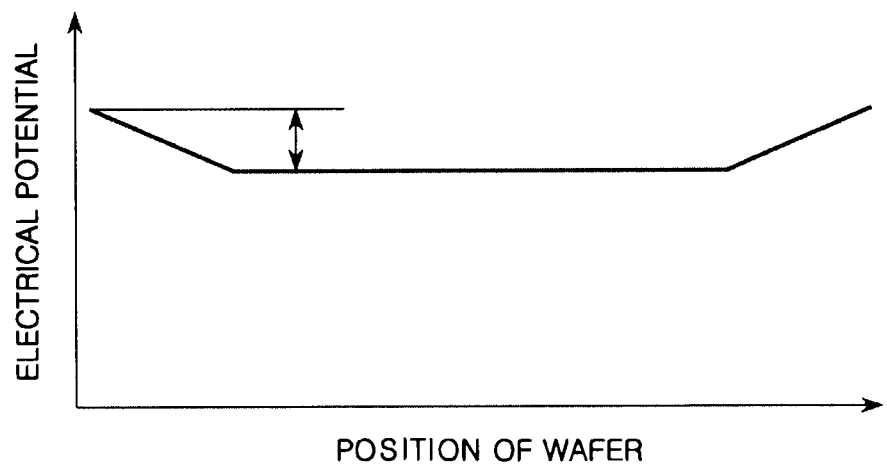

Accordingly, as shown in FIG. 5A, the high frequency current flowing through the peripheral portion of the wafer W flows not through the central portion of the wafer W but through the central portion 37a of the electrode film 37. In such a case, the electric potential at the wafer W is changed in the peripheral portion but not in the central portion as shown in FIG. 5B. As a result, any large voltage difference is not generated from the peripheral portion of the wafer W toward the central portion of the wafer W, so that it can be possible to prevent deterioration of the gate oxide film of the device caused by a charge-up damage.

Further, since the resistance $R_E$ of the electrode film needs be set large to prevent the non-uniformity in distribution of electron density of the plasma in the processing space when the high frequency power is supplied from the first high-frequency power supply 28 as described above, at least the resistance $R_{EO}$ of the peripheral portion 37b of the electrode film 37 is set to be larger than the resistance $R_w$ of the peripheral portion of the wafer W. Accordingly, the surface resistivity of the central portion 37a becomes smaller than that of the peripheral portion 37b in the electrode film 37.

A potential distribution was simulated by the inventors with respect to the surface resistivity ($2\times10^3\Omega/\square$, $2\times10^2\Omega/\square$, $2\times10\Omega/\square$, $2\Omega/\square$) in a plurality of central portions 37a to find the surface resistivity in the central portion 37a of the electrode film 37 which enables a high frequency current may flow not through the central portion of the wafer W but through the central portion of the electrode film 37. In this case, the surface resistivity of the wafer W was $26\Omega/\square$, the surface resistivity of the peripheral portion 37b of the electrode film 37 was $2\times10^5\Omega/\square$, and the frequency of the high frequency power supplied from the second high-frequency power supply 29 was 2 MHz. In comparison, another potential distribution was simulated with respect to a case where the surface resistivity of the entire surface of the electrode film 37 is $2\times10^3\Omega/\square$.

Further, to find the optimal location of a boundary between the peripheral portion 37b and the central portion 37a in the electrode film 37, the potential distribution was also simulated with respect to for the cases of differing locations of a plurality of boundaries, i.e., a case where a boundary is positioned about 10 mm to a periphery of the lower electrode 20 from a peripheral end of the dielectric layer 21; a case where a boundary is positioned at the same location as that of the peripheral end of the dielectric layer 21; and a case where a boundary is positioned about −10 mm to the periphery of the lower electrode 20 from the peripheral end of the dielectric layer 21.

Figure 6A:
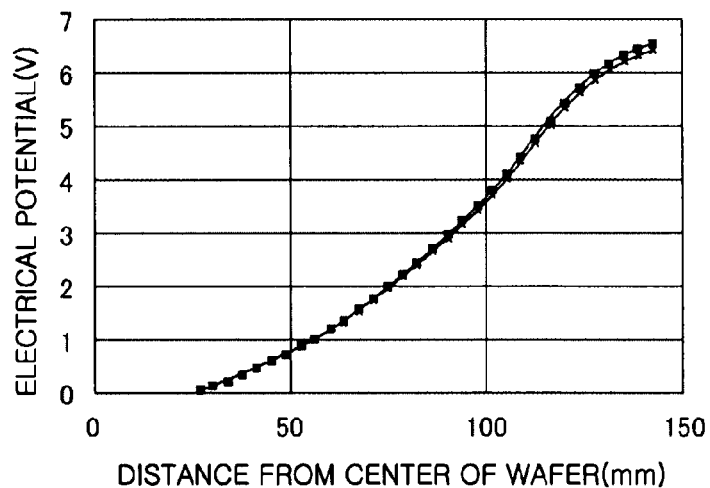
Figure 6B:
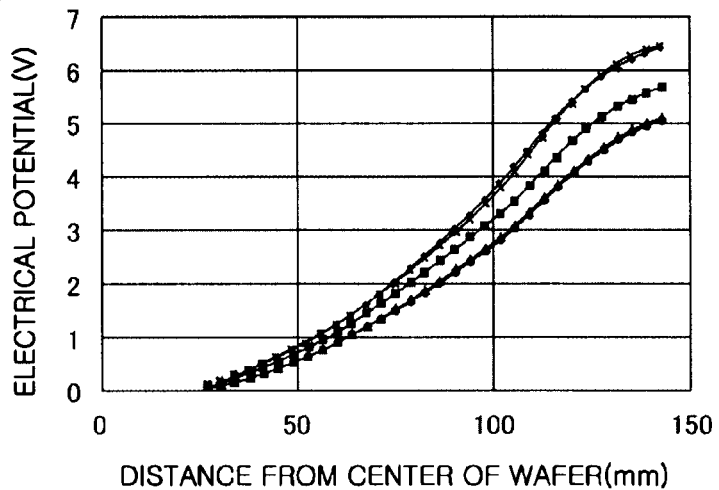
Figure 6C:
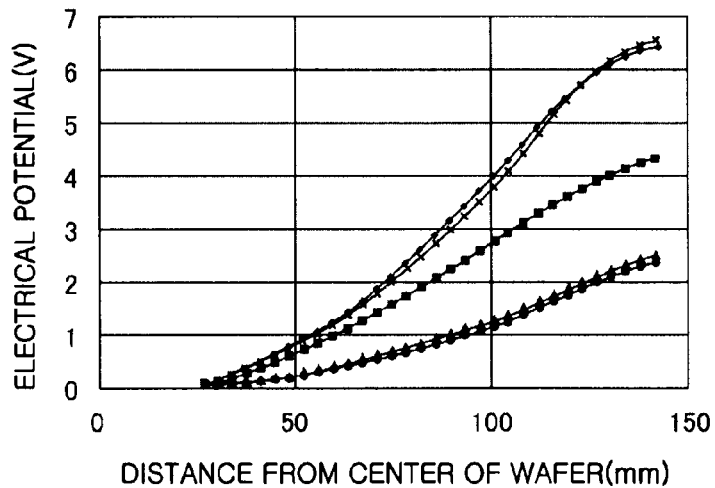

FIGS. 6A to 6C depict results of the potential distribution simulated on the wafer W when the high frequency power supplied from the second high-frequency power supply 29 has a frequency of 2 MHz. FIG. 6A depicts a result of the potential distribution simulated in a case where the boundary is positioned about −10 mm closer to the periphery of the lower electrode 20 from the peripheral end of the dielectric layer 21, FIG. 6B depicts a result of the potential distribution simulated in a case where the boundary is positioned at the same location as that of the peripheral end of the dielectric layer 21, and FIG. 6C depicts a result of the potential distribution simulated in a case where the boundary is positioned about +10 mm closer to the periphery of the lower electrode 20 from the peripheral end of the dielectric layer 21.

In each graph, when the surface resistivity of the central portion 37a of the electrode film 37 is $2\times10^3\Omega/\square$, the result is marked as "♦", when the surface resistivity of the central portion 37a of the electrode film 37 is $2\times10^2\Omega/\square$, the result is marked as "■", when the surface resistivity of the central portion 37a of the electrode film is $2\times10\Omega/\square$, the result is marked as "▲", when the surface resistivity of the central portion 37a of the electrode film 37 is $2\Omega/\square$, the result is marked as "●", and when the surface resistivity of the entire surface of the electrode film 37 is $2\times10^3\Omega/\square$, the result is marked as "×".

In comparison with the graphs depicted in FIGS. 6A to 6C, it was found that in the case where the boundary is positioned about −10 mm to the periphery of the lower electrode 20 from the peripheral end of the dielectric layer 21 (FIG. 6A) or in the case where the boundary is positioned at the same location as that of the peripheral end of the dielectric layer 21 (FIG. 6B), a voltage difference from the peripheral portion of the wafer W toward the central portion thereof is still large.

However, in the case where the boundary is positioned about 10 mm to the periphery of the lower electrode 20 from the peripheral end of the dielectric layer 21 (FIG. 6C), if the surface resistivity of the central portion 37a is $2\times10^2\Omega/\square$ or less, particularly $2\times10\Omega/\square$ or less, the high frequency current flows not through the central portion of the wafer W but through the central portion of the electrode film 37, so that the voltage difference from the peripheral portion of the wafer W toward the central portion becomes small.

Further, a potential distribution was simulated by the inventors when the high frequency power supplied from the second high-frequency power supply 29 has a frequency of 13 MHz in a manner similar to the case the high frequency power supplied from the second high-frequency power supply 29 has a frequency of 2 MHz.

Figure 7:
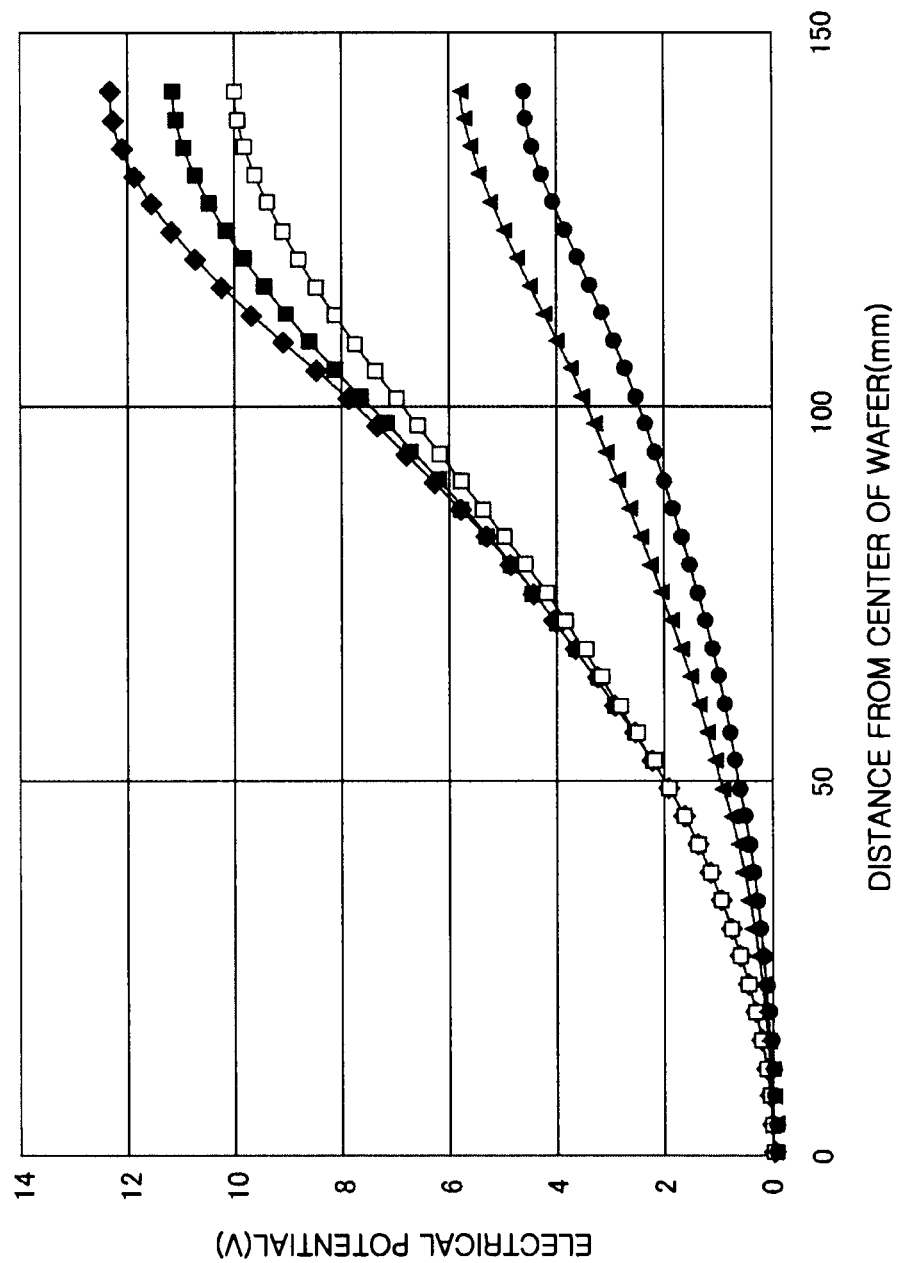
FIG. 7 is a view illustrating a simulation result of a potential distribution in a wafer when high frequency power supplied from a second high-frequency power supply has a frequency of 13 MHz.

FIG. 7 depicts a result of a potential distribution simulated in the wafer W when high frequency power supplied from the second high-frequency power supply 29 has a frequency of 13 MHz, wherein when the surface resistivity of the central portion 37a of the electrode film 37 is $2\times10^3\Omega/\square$, the result is marked as "♦", when the surface resistivity of the central portion 37a is $2\times10^2\Omega/\square$, the result is marked as "■", when the surface resistivity of the central portion 37a is $1\times10^2\Omega/\square$, the result is marked as "□", when the surface resistivity of the central portion 37a is $2\times10\Omega/\square$, the result is marked as "▲", and when the surface resistivity of the central portion 37a is 2Ω/□, the result is marked as "●". In the result simulated in FIG. 7, the boundary is positioned about +10 mm closer to the peripheral portion of the lower electrode 20 than the peripheral end of the dielectric layer 21.

It was also found in FIG. 7 that when the surface resistivity of the central portion 37a is 1×10²Ω/□ or less, particularly 2×10Ω/□ or less, the high frequency current flows not through the central portion of the wafer W but through the central portion of the electrode film 37, so that the voltage difference from the peripheral portion of the wafer W toward the central portion of the wafer W becomes small.

To prevent the deterioration of the gate oxide film caused by a charge-up damage to the device based on the results of simulation of the potential distribution, the surface resistivity of the peripheral portion 37b of the electrode film 37 is set 2×10⁵Ω/□ or more and the surface resistivity of the central portion 37a is set 2×10²Ω/□ or less, for example, 2×10Ω/□ or less, while positioning the boundary 10 mm or more closer to the peripheral portion of the lower electrode 20 than the peripheral end of the dielectric layer 21.

Reducing the surface resistivity of the central portion 37a of the electrode film 37 may raise concerns that the electron density of a plasma may be non-uniformly distributed in the processing space in case that high-power, high frequency power is supplied from the first high-frequency power supply 28. Therefore, a simulation was performed by the inventors with respect to a strength distribution of a sheath field when high-power, high frequency power is supplied from the first high-frequency power supply 28.

Even in this case, a distribution of a sheath field strength was simulated for the surface resistivity (2×10³Ω/□, 2×10²Ω/□, 2×10 Ω/□, 2Ω/□) of a plurality of central portions 37a and a distribution of a sheath field strength was also simulated for a case where the surface resistivity of the entire surface of the electrode film 37 is 2×10³Ω/□ for comparison.

Figure 8:
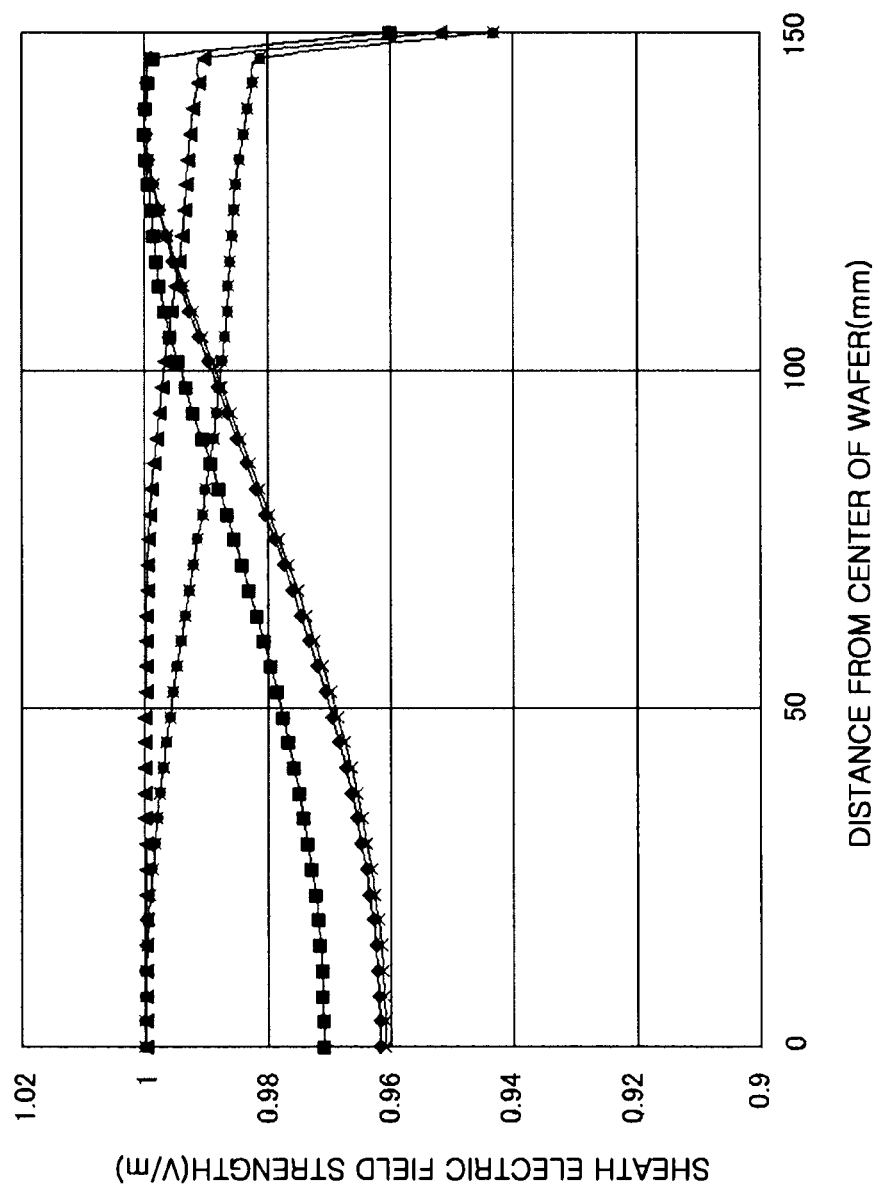
FIG. 8 is a view illustrating a simulation result of a sheath electric field strength distribution when high frequency power supplied from a first high-frequency power supply has a frequency of 100 MHz.

FIG. 8 depicts a graph showing a result of simulation of sheath field strength distribution when the high frequency power supplied from the first high-frequency power supply 28 has a frequency of 100 MHz.

In the graph depicted in FIG. 8, also, when the surface resistivity of the central portion 37a of the electrode film 37 is 2×10³Ω/□, the result is marked as "◆", when the surface resistivity of the central portion 37a is 2×10²Ω/□, the result is marked as "■", when the surface resistivity of the central portion 37a is 2×10Ω/□, the result is marked as "▲", when the surface resistivity of the central portion 37a is 2Ω/□, the result is marked as "●", and when the surface resistivity of the entire surface of the electrode film 37 is 2×10³Ω/□, the result is marked as "×".

As can be seen in the graph shown in FIG. 8, although the surface resistivity of the central portion 37a was changed between 2×10³Ω/□ to 2Ω/□, the distribution of sheath field strength was changed only by about 4%.

Figure 9:
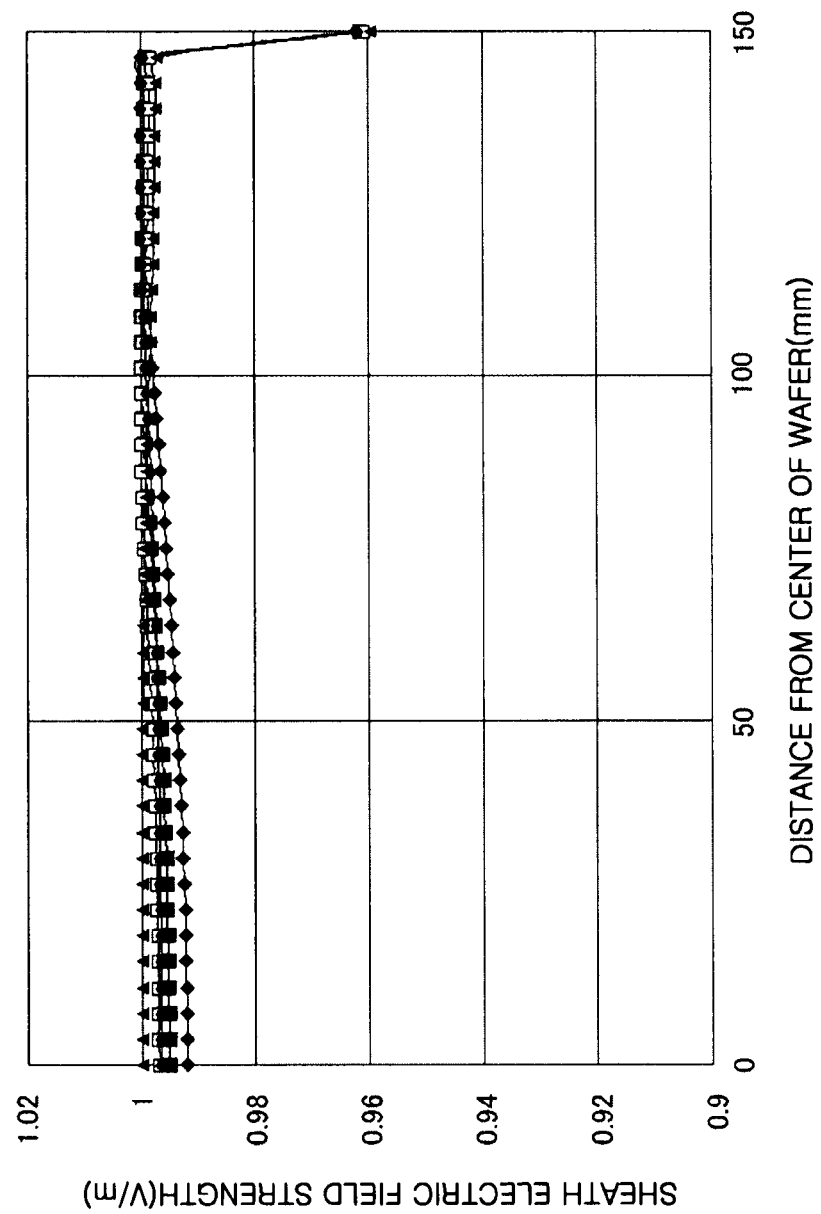
FIG. 9 is a view illustrating a simulation result of a sheath electric field strength distribution when high frequency power supplied from a first high-frequency power supply has a frequency of 40 MHz.
Figure 10A:
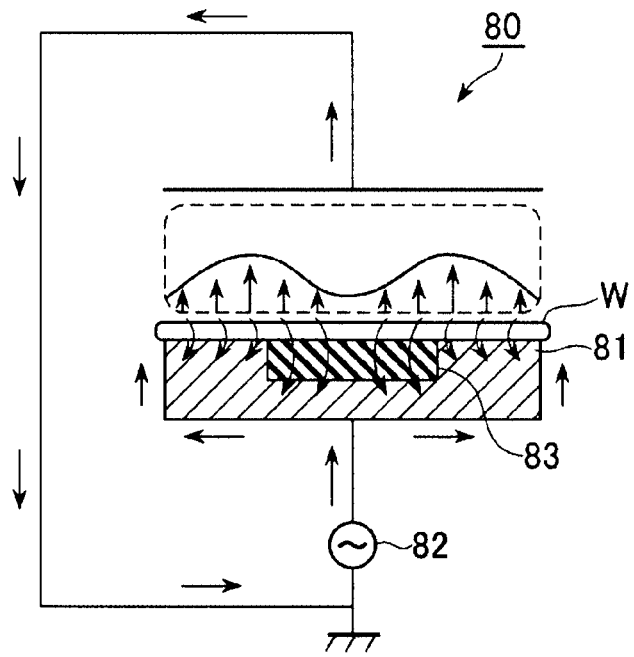
Figure 10B:
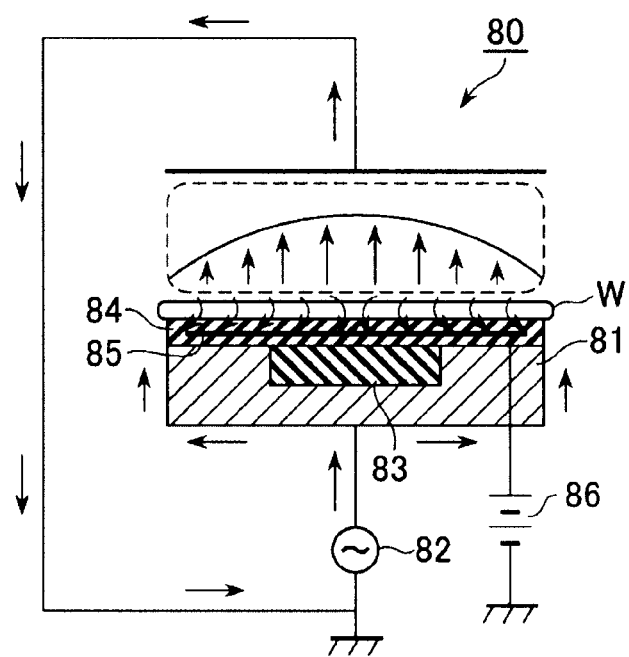
Figure 11A:
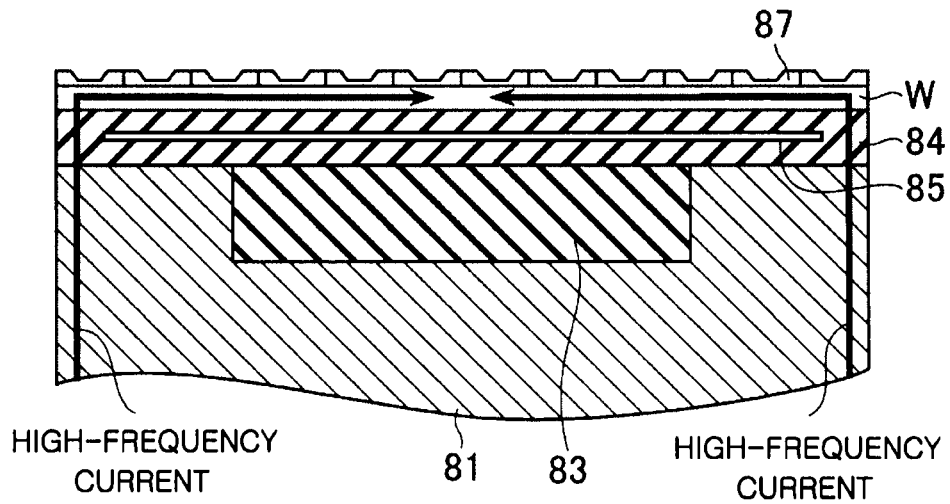
FIGS. 11A and 11B depict a high frequency current at an electrode film and a potential at a wafer in a mounting table of a conventional plasma processing apparatus, wherein FIG.
Figure 11B:
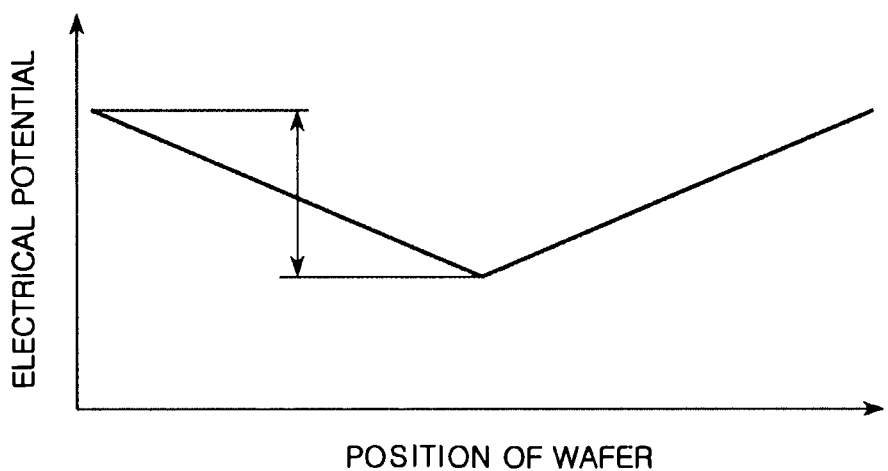

FIG. 9 is a graph illustrating a result of simulation of a sheath field strength distribution when high frequency power supplied from the first high-frequency power supply 28 has a frequency of 40 MHHz.

In the graph depicted in FIG. 9, when the surface resistivity of the central portion 37a of the electrode film is 2×10³Ω/□, the result is marked as "◆", when the surface resistivity of the central portion 37a is 2×10²Ω/□, the result is marked as "■", when the surface resistivity of the central portion 37a is 1×10²Ω/□, the result is marked as "□", when the surface resistivity of the central portion 37a is 2×10Ω/□, the result is marked as "▲", and when the surface resistivity of the central portion 37a is 2Ω/□, the result is marked as "●".

As can be seen in the graph shown in FIG. 9, although the surface resistivity of the central portion 37a was changed between 2×10³Ω/□ to 2Ω/□, the distribution of sheath field strength was changed only by about 1%.

As described above, it was identified that the electron density of a plasma was not non-uniformly distributed in the processing space in case that high-power, high frequency power is supplied from the first high-frequency power supply 28 within a setup range for the surface resistivity of the central portion 37a in this embodiment.

In the mounting table 12 in accordance with the embodiment, there is provided the electrostatic chuck 22 having the electrode film 37 that satisfies a condition "δ/z 85" and a condition "surface resistivity of the wafer W>surface resistivity of the central portion 37a of the electrode film 37".

As the skin depth δ increases, an electric field easily penetrates into the electrode film 37, so that a high frequency current is prone to pass through the electrode film 37 in a thickness direction thus to penetrate into the dielectric layer 21.

Accordingly, if δ/z≧85, most of a high frequency current from the first high-frequency power supply 28 may penetrate through the electrode film 37 in a thickness direction without flowing through the electrode film 37 thus to penetrate into the dielectric layer 21.

As a consequence, a hollow cylindrical resonance of TM mode may be generated so that an electron density of a plasma may be nearly uniformly distributed in the processing space. Further, since the surface resistivity of the wafer W is larger than that of the central portion 37a of the electrode film 37, a high frequency current from the second high-frequency power supply 29 flows through a peripheral portion of the wafer W and then not through a central portion of the wafer W but through the central portion 37a of the electrode film 37.

Accordingly, a potential at the central portion of the wafer W is not changed, so that a large voltage difference may be prevented from occurring from the peripheral portion of the wafer W toward the central portion of the wafer W. Consequently, it may be possible to prevent deterioration of the gate oxide film due to a charge-up damage to the device.

Further, in the mounting table 12 in accordance with the embodiment, the electrode film 37 satisfies a condition "115Ω/□≦ρs".

As the surface resistivity of the electrode film 37 increases, it is difficult for a high frequency current to flow through the electrode film 37, so that it is easy for the high frequency current to penetrate into the electrode film 37 in a thickness direction thus to plunge. Accordingly, if 115Ω/□≦ρs, a high frequency current from the first high-frequency power supply 28 mostly may pass through the electrode film 37 in a thickness direction to penetrate into the dielectric layer 21 without flowing through the electrode film 37. As a consequence, a hollow cylindrical resonance of TM mode may be generated so that an electron density of a plasma may be nearly uniformly distributed in the processing space.

In the above-described mounting table 12, the electrode film 37 satisfies a condition "surface resistivity of a peripheral portion of the electrode film 37>surface resistivity of the central portion 37a of the electrode film 37", so that more current flows to the central portion 37a of the electrode film 37 rather than the peripheral portion 37b of the electrode film 37. That is, since energy originating from the high frequency current focuses on an upper part of the dielectric layer 21, it is easy for the hollow cylindrical resonance of TM mode to occur, thus making it possible to certainly reduce the electric field strength in a space vertically facing the central portion 37a (that is, central portion of the wafer W) of the electrode film 37.

In the above-described mounting table 12, further, a boundary between the central portion 37a and the peripheral portion 37b of the electrode film 37 is positioned 10 mm or more closer to a peripheral portion of the lower electrode 20 than a peripheral end of the dielectric layer 21, so that a portion of the electrode film 37 whose surface resistivity is lower than the wafer W, is expanded and a high frequency current more actively flows through the electrode film 37 than through the wafer W. Accordingly, it may be possible to reduce the amount of high frequency current flowing through the wafer W, thus making it possible to prevent a large voltage difference from being generated in the wafer W. Further, more high frequency current flows to a central portion of the electrode film 37 located over the dielectric layer 21, so that energy originating from the high frequency current focuses more on the central portion, thus making it possible to more certainly create the hollow cylindrical resonance of TM mode.

In this embodiment, the surface resistivity of the wafer W is set more than 26Ω/□. Since the surface resistivity of wafers W generally available is equal to or more than 26Ω/□, it may be possible to allow a high frequency current from the second high-frequency power supply 29 to certainly flow not through a central portion of the wafer W but through the central portion 37a of the electrode film 37 with respect to wafers W generally available in the electrode film 37 that satisfies a condition "surface resistivity of the wafer W>surface resistivity of the central portion 37a of the electrode film 37".

Although the semiconductor wafer W has been used as a substrate on which RIE or ashing is performed in the above-described embodiment, the substrate on which RIE or ashing is performed is not limited thereto. For example, an LCD (Liquid Crystal Display) or FPD (Flat Panel Display) may be used as the substrate.

In accordance with the mounting table and the plasma processing apparatus described above, there is provided an electrostatic chuck having an electrode film that satisfies a condition "δ/z≧85" and a condition "surface resistivity of substrate>surface resistivity at central portion of electrode film". Here, δ (skin depth) refers to a thickness by which the electric field strength is reduced only by 1/e in the electrode film, wherein as δ increases, the electric field easily penetrate into the electrode film, so that a high frequency current passes through the electrode film in a thickness direction to penetrate. Accordingly, when δ/z≧85, most of a high frequency current from a high frequency power supply for generating a plasma propagates the electrode film in a thickness direction without flowing through the electrode film, and can penetrate into the dielectric layer. Consequently, a hollow cylindrical resonance of TM mode may be generated to allow the electric field strength to be uniformly distributed in a space opposite to the substrate and a DC-like current may be prevented from being generated in the substrate. Further, since the surface resistivity of substrate is larger than the surface resistivity at the central portion of the electrode film, a high frequency current from a high frequency power supply for attracting ions first flows through a peripheral portion of the substrate and then through the central portion of the electrode film but not through the central portion of the substrate. Accordingly, potential is not changed in the central portion of the substrate, and this may prevent a large potential from being generated from the peripheral portion of the substrate toward the central portion of the substrate. As a result, an insulation film may be prevented from being deteriorated in the semiconductor device placed on the substrate.

Further, it may be possible to generate a plasma that has low ion energy and high electron density.

Further, it may be possible to certainly draw ions from the plasma into the substrate placed on the mounting table.

Furthermore, the surface resistivity of the substrate is equal to or more than 26Ω/□. Since substrates commercially available generally have the surface resistivity of 26Ω/□ or more, the electrode film satisfying a condition "surface resistivity of the substrate>surface resistivity at the central portion of the electrode film" allows a high frequency current to certainly flow not through the central portion of the substrate but through the central portion of the electrode film with respect to the substrates commercially available.

While the invention has been shown and described with respect to the embodiment, it will be understood by those skilled in the art that various changes and modifications may be made without departing from the scope of the invention as defined in the following claims.

What is claimed is:

1. A mounting table for use in a plasma processing apparatus on which a substrate is to be mounted, comprising:
a conductive member connected to a high frequency power supply for generating a plasma;
a dielectric layer embedded in a central portion of the conductive member;
an electrostatic chuck disposed on the dielectric layer; and
an electrode film contained in the electrostatic chuck and connected to a high voltage DC power supply,
wherein a surface resistivity of a central portion of the electrode film is smaller than a surface resistivity of the substrate,
wherein $\delta/z \geqq 85$ and $\delta=(\rho_v/(\mu\pi f))^{1/2}$,
wherein z refers to a thickness of the electrode film; δ refers to a skin depth of the electrode film with respect to high frequency power supplied from the high frequency power supply for generating the plasma; f refers to a frequency of high frequency power supplied from the high frequency power supply for generating the plasma; π refers to the circular constant; μ refers to a permeability of the electrode film; and $\rho_v$ refers to a resistivity of the electrode film and
wherein the surface resistivity of the central portion of the electrode film is smaller than a surface resistivity of a peripheral portion of the electrode film.

2. The mounting table of claim 1, wherein the surface resistivity of the central portion of the electrode film is $2 \times 10^2$Ω/□ or less.

3. The mounting table of claim 1, wherein the high frequency power supply for generating the plasma supplies high frequency power having a frequency of 40 MHz or more.

4. The mounting table of claim 1, wherein the conductive member is connected to another high frequency power supply for attracting ions, wherein the another high frequency power supply supplies high frequency power having a frequency of 13.56 MHz or less.

5. The mounting table of claim 1, wherein the surface resistivity of the substrate is 26Ω/□ or more.

6. The mounting table of claim 1, wherein a resistance of the central portion of the electrode film is smaller than a resistance of the substrate.

7. The mounting table of claim 1, wherein the surface resistivity of the central portion of the electrode film is 20Ω/□ or less.

8. The mounting table of claim 7, wherein the surface resistivity of the peripheral portion of the electrode film is $2\times10^5\Omega/\square$ or more.

9. The mounting table of claim 7, wherein the surface resistivity of the substrate is smaller than the surface resistivity of the peripheral portion of the electrode film.

10. The mounting table of claim 1, wherein $\rho_s$ is $\geq 115\Omega/\square$, wherein $\rho_s$ refers to a surface resistivity of the electrode film and is based on the surface resistivity of the central portion and the surface resistivity of the peripheral portion of the electrode film.

11. The mounting table of claim 1, wherein the central portion and the peripheral portion of the electrode film have a boundary along a radial direction with respect to the electrode film, and wherein the boundary is located closer to a peripheral end of the conductive member than to a peripheral end of the dielectric layer.

12. A mounting table for use in a plasma processing apparatus, on which a substrate is to be mounted, comprising:
a conductive member connected to a high frequency power supply for generating a plasma;
a dielectric layer disposed in a central portion of the conductive member;
an electrostatic chuck disposed on the dielectric layer; and
an electrode film contained in the electrostatic chuck and connected to a high voltage DC power supply,
wherein a surface resistivity of a central portion of the electrode film is smaller than a surface resistivity of the substrate,
wherein $115\Omega/\square \leq \rho_s$,
wherein $\rho_s$ refers to a surface resistivity of the electrode film, and
wherein the surface resistivity of the central portion of the electrode film is smaller than a surface resistivity of a peripheral portion of the electrode film.

13. The mounting table of claim 12, wherein the surface resistivity of the central portion of the electrode film is $2\times10^2\Omega/\square$ or less.

14. The mounting table of claim 12, wherein the high frequency power supply for generating the plasma supplies high frequency power having a frequency of 40 MHz or more.

15. The mounting table of claim 12, wherein the conductive member is connected to another high frequency power supply for attracting ions, wherein the another high frequency power supply supplies high frequency power having a frequency of 13.56 MHz or less.

16. The mounting table of claim 12, wherein the surface resistivity of the substrate is $26\Omega/\square$ or more.

17. The mounting table of claim 12, wherein a resistance of the central portion of the electrode film is smaller than a resistance of the substrate.

18. A plasma processing apparatus comprising:
a processing vessel configured to form an airtight seal; and
a mounting table on which a substrate is to be mounted, the mounting table comprising:
a conductive member connected to a high frequency power supply for generating a plasma;
a dielectric layer embedded in a central portion of the conductive member;
an electrostatic chuck disposed on the dielectric layer; and
an electrode film contained in the electrostatic chuck and connected to a high voltage DC power supply,
wherein a surface resistivity of a central portion of the electrode film is smaller than a surface resistivity of the substrate,
wherein $\delta/z \geq 85$ and $\delta = (\rho_v/(\mu\pi f))^{1/2}$,
wherein z refers to a thickness of the electrode film; $\delta$ refers to a skin depth of the electrode film with respect to high frequency power supplied from the high frequency power supply for generating the plasma; f refers to a frequency of high frequency power supplied from the high frequency power supply for generating the plasma; $\pi$ refers to the circular constant; $\mu$ refers to a permeability of the electrode film; and $\rho_v$ refers to a resistivity of the electrode film, and
wherein the surface resistivity of the central portion of the electrode film is smaller than a surface resistivity of a peripheral portion of the electrode film.

19. A plasma processing apparatus comprising:
a processing vessel configured to form an airtight seal; and
a mounting table on which a substrate is to be mounted, the mounting table comprising:
a conductive member connected to a high frequency power supply for generating a plasma;
a dielectric layer disposed in a central portion of the conductive member;
an electrostatic chuck disposed on the dielectric layer; and
an electrode film contained in the electrostatic chuck and connected to a high voltage DC power supply,
wherein a surface resistivity of a central portion of the electrode film is smaller than a surface resistivity of the substrate, and
wherein $115\Omega/\square \leq \rho_s$,
wherein $\rho_s$ refers to a surface resistivity of the electrode film, and
wherein the surface resistivity of the central portion of the electrode film is smaller than a surface resistivity of a peripheral portion of the electrode film.

20. A mounting table on which a substrate is to be mounted, the mounting table being used for a plasma processing apparatus and comprising:
a conductive member connected to a high frequency power supply for generating a plasma;
a dielectric layer disposed in a central portion of the conductive member;
an electrostatic chuck mounted on the dielectric layer, and
an electrode film contained in the electrostatic chuck and connected to a high voltage DC power supply,
wherein resistance of a central portion of the electrode film is smaller than a resistance of the substrate,
wherein $\delta/z \geq 85$, where $\delta = (\rho_v/(\mu\pi f))^{1/2}$,
wherein z refers to a thickness of the electrode film; $\delta$ refers to a skin depth of the electrode film with respect to high frequency power supplied from the high frequency power supply for generating the plasma; f refers to a frequency of the high frequency power supplied from the high frequency power supply; $\pi$ refers to the circular constant; $\mu$ refers to a permeability of the electrode film; and $\rho_v$ refers to a resistivity of the electrode film, and
wherein a surface resistivity of the central portion of the electrode film is smaller than a surface resistivity of a peripheral portion of the electrode film.

21. A mounting table on which a substrate is to be mounted, the mounting table being used for a plasma processing apparatus and comprising:
a conductive member connected to a high frequency power supply for generating a plasma;
a dielectric layer disposed in a central portion of the conductive member;
an electrostatic chuck disposed on the dielectric layer; and
an electrode film contained in the electrostatic chuck and connected to a high voltage DC power supply, wherein $\delta/z \geqq 85$ and $\delta = (\rho_v/(\mu\pi f))^{1/2}$,
wherein a surface resistivity of a central portion of the electrode film is smaller than a surface resistivity of the substrate, and wherein a high frequency current flowing through a peripheral portion of the substrate does not flow through a central portion of the substrate but flows through the central portion of the electrode film, and wherein an electric potential is changed in the peripheral portion of the substrate but not in the central portion of the substrate,
wherein z refers to a thickness of the electrode film; $\delta$ refers to a skin depth of the electrode film with respect to high frequency power supplied from the high frequency power supply; f refers to a frequency of high frequency power supplied from the high frequency power supply for generating the plasma; $\pi$ refers to the circular constant; $\mu$ refers to a permeability of the electrode film; and $\rho_v$ refers to a resistivity of the electrode film, and
wherein the surface resistivity of the central portion of the electrode film is smaller than a surface resistivity of a peripheral portion of the electrode film.

\* \* \* \* \*